US008617908B2

(12) United States Patent  (10) Patent No.: US 8,617,908 B2
Gaillard et al.  (45) Date of Patent: Dec. 31, 2013

(54) METHOD FOR PRODUCING A SUBSTRATE INCLUDING A STEP OF THINNING WITH STOP WHEN A POROUS ZONE IS DETECTED

(75) Inventors: Frederic-Xavier Gaillard, Voiron (FR); Fabrice Nemouchi, Moirans (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/045,080

(22) Filed: Mar. 10, 2011

(65) Prior Publication Data

US 2011/0244601 A1  Oct. 6, 2011

(30) Foreign Application Priority Data

Mar. 10, 2010  (FR) ..................... 10 51714

(51) Int. Cl.
*H01L 21/66* (2006.01)
(52) U.S. Cl.
USPC ........... 438/5; 257/E21.529; 438/692; 438/14
(58) Field of Classification Search
USPC .......... 438/5–17, 699–692, 757–753; 216/84; 451/285–289
See application file for complete search history.

(56) References Cited

U.S. PATENT DOCUMENTS

| 6,054,363 | A | 4/2000 | Sakaguchi et al. | |
| 6,190,937 | B1* | 2/2001 | Nakagawa et al. | 438/67 |
| 6,301,006 | B1 | 10/2001 | Doan | |
| 6,633,066 | B1* | 10/2003 | Bae et al. | 257/347 |
| 7,049,624 | B2* | 5/2006 | Ikeda et al. | 257/3 |
| 2011/0221015 | A1* | 9/2011 | Gaillard et al. | 257/418 |

FOREIGN PATENT DOCUMENTS

DE  101 00 194 A1  7/2001

OTHER PUBLICATIONS

French Preliminary Search Report issued Oct. 22, 2010, in French 1051714, filed Mar. 10, 2010 (with English Translation of Categories of Cited Documents).
Takao Yonehara, et al., "Epitaxial layer transfer by bond and etch back of porous Si", Applied Physics Letters, vol. 64, No. 16, XP000440703, 1994, 3 pages.
W.P. Maszara, "Wafer bonding: SOI, generalized bonding, and new structures", Microelectronic Engineering vol. 22, No. 1-4, XP024436855, 1993, pp. 299-306.
Yi-Ping Huang, et al., "Epitaxial Growth of High-Quality Silicon Films on Double-Layer Porous Silicon", Chin. Phys. Lett., vol. 18, No. 11, 2001, pp. 1507-1509.
European Search Report issued May 25, 2011, in Patent Application No. EP 11 15 7319.

* cited by examiner

*Primary Examiner* — Savitr Mulpuri
(74) *Attorney, Agent, or Firm* — Oblon, Spivak, McClelland, Maier & Neustadt, L.L.P.

(57) ABSTRACT

A method for producing a substrate, the method including: forming a porous zone in an inner layer of the substrate; progressively thinning a thickness of the substrate towards the inner layer including the porous zone; completing the progressively thinning by polishing; and controlled stopping of the polishing by detecting the porous zone during the polishing, the detecting including measuring at least one measurable physical parameter admitting a significant variation during a transition between two layers.

23 Claims, 4 Drawing Sheets

METHOD FOR PRODUCING A SUBSTRATE INCLUDING A STEP OF THINNING WITH STOP WHEN A POROUS ZONE IS DETECTED

TECHNICAL FIELD OF THE INVENTION

The present invention relates to the technology of integrated circuits in general and more particularly discloses a method enabling the precise control of the thinning of a substrate within the scope of the production of devices from both faces of said substrate.

STATE OF THE ART

Although integrated circuits technology has significantly progressed since the introduction and wide use thereof as from the beginning of the sixties, it has however remained close, in principle, to the initial method of production. Starting from a substrate, i.e. a very thin wafer cut from an ingot made of a monocrystalline semiconductor material, essentially silicon, all the operations making it possible to produce integrated circuits are carried out from only one of the faces of the substrate. This face has previously been carefully submitted to a mechanical and/or chemical processing until an optical quality polishing has been obtained. From this base component used by the whole microelectronics industry, and generally produced by specialised manufacturers, all the operations are successively carried out to provide, on the polished surface of the substrate, from only one of the faces, the integrated circuits which may be the simplest or the most complex.

Techniques such as: epitaxy, deposition, etching, ionic implantation, photolithography, heat treatment, chemical-mechanical polishing, cleaning/scouring are currently used when manufacturing microelectronic components.

Although the above-mentioned techniques, and more particularly photolithography, had to significantly progress during the last decades, which have undergone, from the sixties, an exponential increase of the density of integration of integrated circuits, technology has remained the same in that the components are still formed at the surface and from only of the faces of the substrate.

It is only more recently that further to the need to have efficient hybrid components, for example, optoelectronic components such as imagers of the type of those which are used in digital cameras and still cameras, wherein the electronic and optical functions are intimately interleaved, it appeared very advantageous to be able to produce such components from both faces of the same substrate. This significantly increased the production opportunities, while enabling a significant increase in the number of their operational characteristics. Then, in the exemplary imager above, the production of electronic circuits and the interconnection thereof can conventionally be executed on one face without interfering with the production of micro lens on the other face and thus without affecting the optical parameters of the component.

There are many other examples wherein the production of devices from the two faces of the same substrate is extremely advantageous, which include hybrid devices also called NEMS or MEMS ("Nano/Micro Electro Mechanical System").

In order to be able to implement this production method, the original substrate, after the production of all or part of the components on one of the faces, must be transferred onto a mechanical support, a second substrate, in order to be able to thin the first one from the other face, and to get, while preserving it, as close as possible to the superficial zone wherein the first component has been produced. To give it a mechanical rigidity, which facilitates the handling thereof, a substrate must, as a matter of fact, be very thick opposite the thin superficial layer wherein the components are to be produced. Its initial surface is however not compatible with the production of performing components from the second face. The first substrate must thus be thinned after the second one has been fixed to continue, from a mechanical point of view. The thinning of the first substrate must then be carried out.

The greatest difficulty met for implementing this technique within the scope of a reproducible industrial process lies in the fact that the stoppage of this thinning in the first substrate must be extremely accurately controlled, in order to preserve the thin superficial layer wherein the whole or part of the components have already been formed from the first face, and this without damaging them.

Thus, an object of the invention is to disclose a method capable of obtaining such results.

Whereas the present techniques provide for a reduction in the thickness by side breaking or cutting the substrate in a weakened thickness zone (which may be porous), the invention recommends a progressive thinning in several phases avoiding the complexity of the above-mentioned method.

The other objects, characteristics and advantages of the present invention will appear upon reading the following description and the accompanying drawings. It should be understood that other advantages can be integrated therein.

SUMMARY OF THE INVENTION

The invention meets this need by disclosing a method for producing a substrate including a step of thinning the thickness of the substrate. The method is characterised in that it includes the following steps: the formation of a porous zone in an inner layer of the substrate; the progressive thinning of the thickness of the substrate towards the inner layer including the porous zone; the completion of the progressive thinning by polishing; and a controlled stoppage of the polishing by detection of the porous zone.

In further aspects of the embodiments of the invention, the method may further include the optional following steps and characteristics:

- polishing is a mechano-chemical or mechanical polishing.
- the porous zone forms the whole inner layer.
- the porous zone includes a plurality of porous portions in the inner layer.
- the formation of the porous zone is executed by the porosification of a predetermined thickness of the surface of a primary substrate followed by the deposition or the growth of at least one covering layer made of a material participating in the production of an electronic device or an hybrid device including an optical and/or a mechanical part.
- the growth of at least one covering layer is executed by epitaxy at a temperature above 750° C.
- temperature is between 900° C. and 1100° C.
- the deposition or the growth of at least one covering layer is followed by the report onto a secondary substrate fixed on the last one of the at least one covering layer.
- the step of progressive thinning of the substrate is quicker than the thinning completion phase.
- the first thinning phase is performed by a chemical attack, by a mechanical abrasion or by a chemical-mechanical polishing (CMP).
- the controlled stoppage of the polishing is performed immediately upon the detection of the porous zone.

the controlled stoppage of the polishing is performed after programmed time after the detection of the porous zone.

the detection of the porous zone is a detection of the transition between a non porous zone and the porous zone.

the detection of the transition is performed upon the passage from a non porous zone to the porous zone during the completion.

the detection of the transition is performed upon the passage from the porous zone to a non porous zone during the completion.

the completion of the progressive thinning by polishing includes:

a preliminary step of completion, a controlled stoppage of the preliminary step of completion by detection of the transition from a non porous zone of the substrate to the porous zone.

a secondary step of completion until the controlled stoppage of the polishing.

the secondary step is carried out at a lower speed than the preliminary step.

the porous zone is detected by exposing the surface being polished to a light source and by monitoring the absorption and/or the optical reflectivity of the surface so as to determine the beginning and/or the end of an attack of the porous layer.

the monitoring of the absorption and/or the optical reflectivity is enhanced by introducing into the abrasive solution an additive intended to scatter into the porous zone.

the additive is a colouring agent, the colour of which is complementary to the range of wavelengths which can be detected by the system monitoring the absorption and/or optical reflectivity of the surface being polished.

the porous zone is detected by measuring the driving torque between the polishing head and plate, so as to determine the changes in friction showing the beginning and/or the end of an attack of the porous layer.

the porous zone is detected by measuring the heating of the substrate so as to determine the changes in temperature showing the beginning and/or the end of an attack of the porous layer.

The invention describes the utilisation of a layer of a semiconductor material such as silicon including at least one porous zone as the detection layer inside a substrate for the controlled stoppage of polishing.

The invention further discloses a method wherein the plurality of porous portions in the inner layer is revealed upon completion of the controlled completion phase of the thinning in order to provide for the alignment of the part of the devices produced from a second face of the substrate with the one already produced from a first face of the substrate.

BRIEF DESCRIPTION OF THE FIGURES

The aims, the objects, as well as the characteristics and the advantages of the invention will appear upon reading the following description of one embodiment of the invention which is illustrated by the following enclosed drawings wherein.

The enclosed drawings are given as examples and are not limiting the invention.

DETAILED DESCRIPTION OF THE INVENTION

Figure 1:
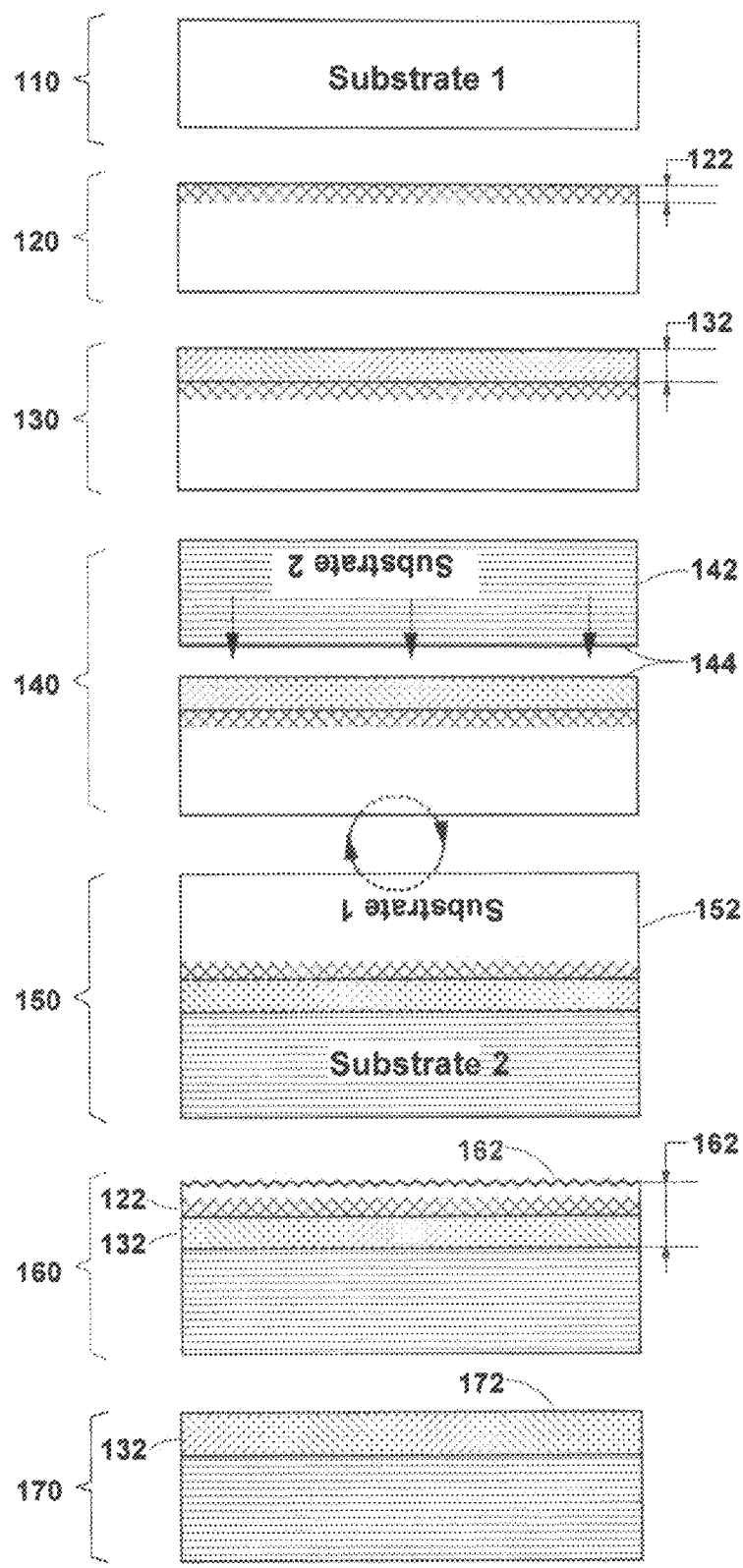
FIG. 1 describes the various steps of the method according to the invention.

FIG. 1 illustrates and discloses the various steps of the method according to the invention.

As already mentioned in the section discussing the state of the art, a base material in the whole industry of semiconductors and microelectronics is currently an often doped monocrystalline substrate of silicon 110 of the P type, and one face of which has generally already received an optical polishing. The thickness thereof is sufficient to give the substrate strength and mechanical rigidity which enable all handling operations during the very numerous steps of production required for the production of integrated circuits on the surface thereof. The substrate is in the form of a thin wafer, the diameter of which currently reaches 30 centimeters and on the surface of which a few hundreds integrated circuits are typically and simultaneously produced, depending on their dimensions. If the substrate is generally made of silicon as mentioned above, the invention makes no assumption however on the nature of the latter except for the fact that it must be porosifiable on the surface. More particularly, using other types of semi-conductive substrates such as germanium, or silicon/germanium (SiGe) alloys can also be considered as reported, for example, in the following publication: "Network dimensionality of porous Si & Ge", S. Bayliss & al, Applied Surface Science, 102, (1996), 390.

Binary semiconductor alloys of the III-V type are also suitable for the invention. This more particularly concerns gallium arsenide (AsGa), indium phosphate (PnP) or gallium nitride (GaN).

The method according to the invention requires a porosification of a superficial layer 122 of the substrate in a first step 120. Generally speaking, any crystalline material, whether semiconductor as those mentioned above, or not, or an alloy of such materials, which can be porosified, is thus liable to compose the substrate 110 from which the method of the invention can be applied. As regards silicon for example, porosification consists in implementing techniques which have been known since the fifties. Exemplary implementations are given in FIG. 2. Depending on the devices to be produced and the applications considered of the method according to the invention, the thickness of the porous layer to be produced 122 as well as the characteristics can be very different. More particularly, the size of the produced pores can vary in an extended range of values typically from a few nanometers ($10^{-9}$ meter) to a few micrometers ($10^{-6}$ meters) on a thickness between, typically, about a hundred nanometers and a few dozens micrometers.

It shall more particularly be noted that the silicon substrates are generally produced with a crystalline orientation noted (100). For some applications, it may be advantageous to use a substrate made of silicon which has already been produced with a different crystalline orientation such as for example: (111), (110) or any other one. The layer of porous silicon described in FIG. 2 will be obtained within the same conditions as for a (100) oriented silicon. Only the porosification rate can be different.

The following step 130 consists in forming above the porous layer 122 the layer or the layers 132 wherein the components shall be created. The invention makes no assumption on the type of components the production of which is liable to take advantage of the process described. The global layer 132 can also include a plurality of layers composed of various materials, including for example silicon under various forms: monocrystalline, polycrystalline, amorphous; and more generally all the semiconductor materials and alloys mentioned above. The global layer 132 can further include oxides which can be used as dielectrics and more particularly include silicon oxide; generally speaking, all the materials currently used by the microelectronics industry and including depositions under a vacuum of the metallic layers of aluminium, copper, gold or silver. The formation of the global layer 132 can be obtained by any means currently used to grow or deposit materials on a substrate.

In the example mentioned hereabove of optoelectronics devices of the imager type, and more generally of any sophisticated electronic device which has to include active elements of the transistor type, the layer 132 will then be advantageously formed by growing a monocrystalline layer by epitaxy directly on the porous layer 122. As the porosified layer keeps the crystalline structure of the substrate wherein it has been formed, all the known types of epitaxial growths can be considered upon the implementation of the invention.

Most of the time, a homo-epitaxy of the silicon on silicon type will be executed. For all the other types of substrates discussed hereabove, a homo-epitaxy is also possible. This will for example be a SiGe epitaxy on a layer of substrate of SiGe or an epitaxy of AsGa onto an AsGa layer or substrate. More generally, a hetero-epitaxy of a material X can be considered on a porosified substrate Y in so far as the crystalline structure of the materials X and Y enables the epitaxial growth to be executed in harmony. For example, on a substrate of silicon with a (100) orientation, a deposition of Si(c), a solid solution with up to 1% of carbon, Ge, SiGe, AsGa and more generally the semiconductor alloys of the III-V type can be epitaxied. On a substrate of silicon with a (111) or (110) orientation, a film of SiC, an intermetallic compound of silicon carbon, can also be epitaxied.

Being able to carry out an epitaxy on a layer of good quality monocrystalline silicon onto porous silicon is more particularly well-known. The conditions for the epitaxy may have to be different from those currently used on solid silicon if the structure of the porous silicon which has already been formed is not to be modified. More particularly, once the porous silicon is produced, a first heat treatment under a vacuum can be applied in order to stabilise the morphology of the porous silicon before carrying out an epitaxy at a so-called low temperature (750° C.). It shall be possible to refer to the following publication: "Epitaxial Growth of High-Quality Silicon Films on Double-Layer Porous Silicon", by Y.-P. Huang, S.-Y. Zhu, A-.Z. Li, J. Wang, J. Y. Huang and Z. Z-Ye, published in Chinese physics letter volume 18 (11), p 1507, year 2001 about this issue.

In this exemplary production of optoelectronic devices or in elaborate devices including active components of the transistor type all the electronics part of the devices will then be traditionally produced in the epitaxial monocrystalline layer 132. This will include, for example, the formation of circuits made of CMOS ("Complementary Metal Oxide Semiconductor") transistors using the standard techniques mentioned in the chapter on the state of the art: oxidation, photolithography, scattering, implantation, metallic deposition, formation of interconnections, etc.

When the parts of the devices which must be manufactured from the first of the faces of the original substrate is completed, the latter must be fixed during the following step 140, onto a second substrate 142 to provide for the transfer of the layer 132 and thus enable the completion of the devices which will be carried out from the second face after the thinning of the original substrate. Fixing the second substrate uses known methods and techniques making it possible to stack, at the wafer level, substrates the circuits of which are partially or totally produced. More particularly, this can be made by an oxide on oxide bonding technique by molecular adhesion at low temperature. Porous silicon can withstand temperatures up to 750° C. without entailing significant modifications in the physical characteristics thereof. Molecular bonding can also be efficiently carried out up to such temperature. The fixing type may require the previous deposition of a protective layer and a preparation of a surface of the substrates 144. The invention makes no assumption on the nature of the second substrate 142 the role of which is essentially to compose a mechanical support for the following operations.

The result is an assembly 150 at the level of the wafer of two substrates, the first of which 152, the original one, must be thinned. For convenience, the representation of the assembly 150 is turned upside down so that the upper face represents the second face of the first substrate, the one from which the devices being produced after thinning will be completed.

In a preferred embodiment of the invention, the thinning is carried out in at least two steps:

during a first step 160 a quick removal of silicon is carried out which can however guarantee that the layer of porous silicon 122, and thus the layer containing the devices 132, are absolutely not affected. For example, the main part of silicon can be removed by mechanical abrasion or chemically or by combining both means. The chemical attack can be carried out using products such as tetramethylammonium hydroxide (TMAH), potassium hydroxide or potassium (KOH), or potassium hydroxide or soda (NaOH). This first step thus preserves a part of the original silicon, the layer of porous silicon and the one containing the devices being produced 162. Upon completion of this quick removal, the surface condition 164 can then be relatively bad.

the second step of the thinning, also called the completion consists in improving the surface condition using a chemical-mechanical polishing until a level and a surface condition 172 compatible with the devices to be produced are obtained. The second step 170 is crucial in that the additional thinning obtained must be very accurately detected to stop as soon as the porous silicon is met, if this layer participates in the production of the device or is exactly at the interface between the porous silicon and the layer 132 containing the part of the components which have been produced from the first face of the original substrate if, as is shown, it must be completely removed. In the case where the porous layer must be totally removed, it can be advantageous to take advantage of the detection of two transitions with the porous layer, i.e. a chronologically first detection of the transition of the substrate to the porous zone, and a chronologically second detection of the transition at the end of the porous layer. For example, a first phase of thinning completion is executed with the polishing parameters (such as rate, chemical active agents) given up to the first detection, and a second thinning completion phase is executed with other polishing parameters (for example not so quick and/or without chemical attack) until the second detection. Finally, after the second detection, a step of completion, such as by CMP polishing, can be executed to obtain a surface condition with an improved quality. The primary role of the layer of porous silicon is to enable the detection. As explained in FIG. 3, various parameters during the chemical-mechanical polishing can be monitored, thus enabling a precise detection of the beginning and the end of the layer of porous silicon 122 and thus a programmed stoppage of polishing. Thus, the layer of porous silicon may be a so-called "sacrificial" layer which will totally disappear, or as a function of the devices to be produced, participate in the production of the devices, in which case the stoppage of polishing will occur as soon as the latter is detected or after an additional programmed time to leave only a part thereof.

Figure 2:
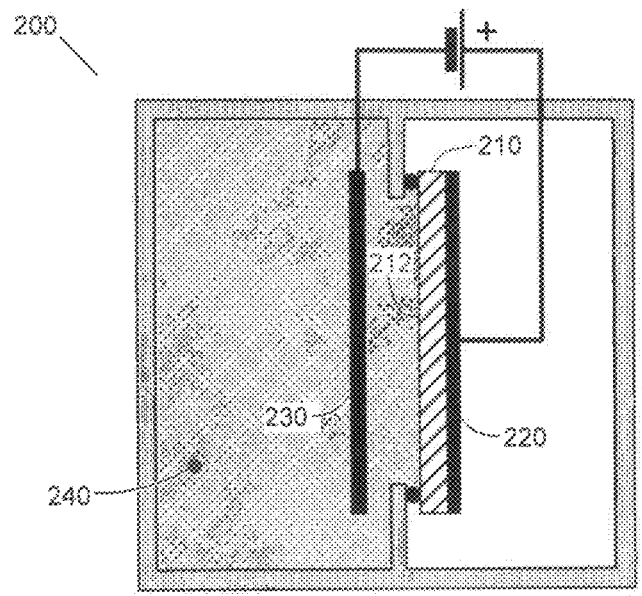
FIG. 2 gives an example of a known means which can be used for controllably making porous the superficial layer of the original substrate.

FIG. 2 gives an exemplary known means which can be used to controllably make the superficial layer 122 of the original substrate porous.

Electro-chemically obtaining porous silicon from monocrystalline silicon is known since the 50 s. Porosification is obtained by an anodic dissolution in presence of hydrofluoric acid (HF). A device 200 of the same type as the one shown in FIG. 2 can be used to process each silicon wafer composing the substrate of the method described in FIG. 1. The face 212 of the substrate 210 which must be porosified is placed in contact with an aqueous medium of hydrofluoric acid 240 the content of which may typically vary from 1% to 50% and advantageously between 5% and 35%. Then, a potential difference or a continuous current is imparted between a cathode 230, immersed in the aqueous solution of hydrofluoric acid and an anode 220 which is in electric contact with the other face of the substrate to be porosified. The hydrofluoric acid content of the aqueous medium, the current value imparted and the anodisation time are, amongst others, parameters which make it possible to control the characteristics of the desired porous layer. More sophisticated apparatuses than the one shown also make it possible to illuminate the aqueous medium by adding an additional control means of the characteristics of the porous layer. Using illumination of the aqueous medium essentially depends on the type of the desired porous semiconductor and the resistivity thereof.

All the conditions of production of the porous layer, i.e.: the electrolytic solution used (the hydrofluoric acid content thereof); the current circulating between an anode and a cathode; the voltage applied; the conditions of illumination as well as the varying nature of the substrate (P, N type, the doping level) interfere to make it possible to control, as a function of the applications, the obtention of pores the dimensions of which may vary in a wide range of values from a few nanometers to a few micrometers.

For example, for a $P^+$ type substrate, the resistivity of which is of the order of a few dozens milliohms/cm, porosification can be directly obtained without requiring any other processing, by anodisation of the substrate in an acid medium. The current density used for porosifying such a material may vary from a few milliAmpere/$cm^2$ to several Amperes/$cm^2$. Generally speaking, the higher the acid content, the higher can the working current densities be without significant drawbacks. It is thus possible to vary the size of the pores within the range of the values mentioned above as well as the porosity rate. The latter may typically reach 10 to 90%.

When a more resistant substrate is used, for example a type P substrate having a resistivity of several Ohms/cm, a processing of the rear face has to be considered to reduce the electric resistance. This will be carried out prior to the step of porosification, for example, by ionic implantation on the rear face of the substrate of a type P dopant.

The morphological characteristics of the obtained porous silicon (pore sizes, porosity rate and thickness) as a function of the conditions implemented for the production thereof and mentioned above (acid medium content, current density, illumination, substrate type) are described in many scientific publications and are the subject of dedicated works. They enable the persons skilled in the art to quickly determine the conditions to be implemented to obtain, on a substrate of a given type, a layer of porous silicon having appropriate characteristics for the type of device to be produced.

Figure 3:
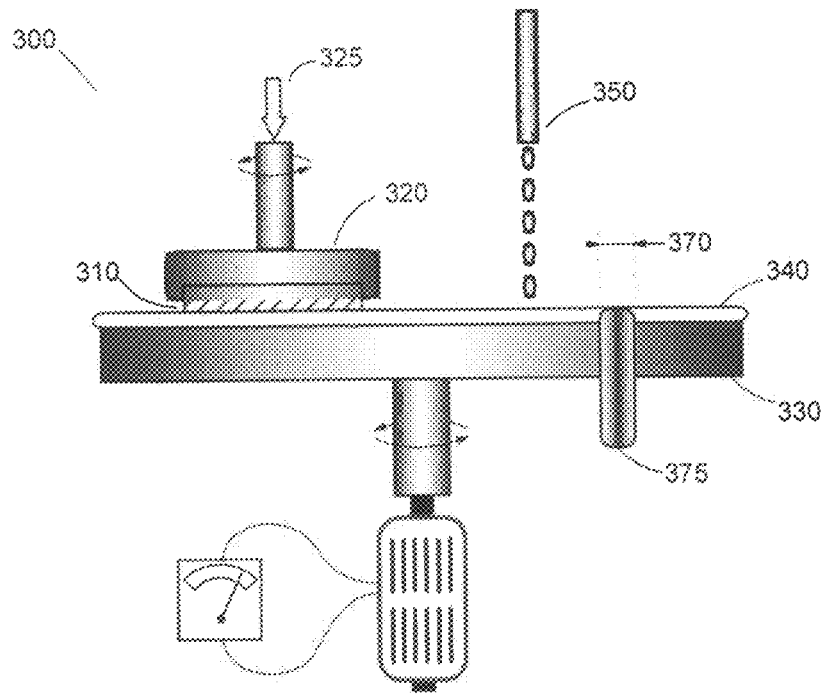
FIG. 3 describes the means implemented during the second step of the chemical-mechanical thinning so as to accurately detect the emergence of the layer of porous silicon.

FIG. 3 describes the means implemented during the second chemical-mechanical thinning step to accurately detect the emergence of the layer of porous silicon.

The chemical-mechanical polishing also often designated by the acronym CMP ("Chemical Mechanical Polishing") is a widely used technique in the field of microelectronics to polish a substrate and to level the patterns obtained after the deposition of thin layers onto a substrate. The surface is polished by friction on a fabric or pad made of visco-elastic porous polyurethane, the properties of which (including hardness, compressibility, pore shapes and dimensions, and patterns shape and dimensions) are adapted to the nature of the material to be polished and to the fineness of the polishing to be obtained. The material at the surface of the substrate is removed by the combination of the mechanical action resulting from the friction on the pad and a chemical reaction with an aqueous solution containing suspended nanometric particles called "slurry". According to the considered applications, the chemical solution is different, it can be acid or basic and include abrasive particles of varied types and dimensions.

To carry out the chemical-mechanical polishing, the silicon wafer is positioned in a device 300 of the type represented in FIG. 3. It is fixed on the rotating polishing head 320, with the face to be polished being oriented downwards. The whole thing rests on the rotating plate 330 whereon the fabric or polishing pad 340 is fixed as described above. The polishing head exerts a pressure 325 onto the silicon wafer. The pressure force and the relative rate between the head and the plate make it possible to control the rate and uniformity of the removal of material. The abrasive solution, the slurry, is continuously dispensed onto the plate with a controlled rate. During the polishing, the abrasive solution is continuously renewed, whereas the suspended polished material therein is evacuated towards the outside of the plate by a centrifugal effect.

In the general scope of the use of this type of polishing machine, the polishing conditions have been carefully studied by the scientific community working in this field. More particularly, the material removal rate has been modelised and can be estimated with a relative accuracy as a function of all the parameters which control it and more particularly pressure, the orbital relative rate of the silicon wafer, the rate of the aqueous solution containing the abrasive particles and the composition thereof, and the room temperature. Reference can be made, for example, to an article by D. Peyrade et al., published in "Microelectronic Engineering 83, p. 1521" in 2006.

However, the invention does not rely on a determination, as accurate as it may be, of the removal rate to stop polishing. This automatically occurs on the detection of the emergence of the layer of porous silicon provided at the surface of the first substrate as described in FIG. 2. The stoppage can optionally occur either at the beginning of the detection or at the end of the detection or within the interval, depending on the whole or part of the layer of porous silicon as a function of the type of device to be produced.

Generally speaking, within the scope of a chemical-mechanical polishing, any measurable physical parameter admitting a significant variation during a transition between two layers can be used as detection means. The invention more particularly considers the following means used alone or in combination to detect the emergence of the layer of porous silicon during the operation of chemical mechanical polishing.

The friction of the wafer 310 on the pad 340 causes heating which is different between the dense silicon of the substrate and that of the porous layer. The measurement of temperature can be monitored to detect the changes therein and thus the transitions between layers of different natures.

Polishing must be executed with a constant speed of rotation of the plate 330. In order to keep this speed constant, a servo-control adjusts the feed current to the engine 360. The more important the friction, the stronger the engine torque must be and the higher the feed current thereof. Reading the feed current of the engine 365 makes it possible to detect the transition between two layers more easily since they have significantly different viscosity, which is the case between the porous silicon on the surface and the dense silicon of the substrate.

The optical properties of the surface vary a lot during the polishing as a function of the materials met: dense and porous silicon in the case of the invention. An inspection window 370 is provided through the plate and the pad, and an optical detection system 375 can be inserted, which can measure some of the properties, for example absorption and reflection of the light emitted by the detection system each time the wafer being polished is above the inspection window. Depending on the considered applications, the range of used wavelengths may vary between those of the so-called X-rays (a dozen nanometers) and that of infrared (beyond 800 nanometers). As the temperature of the wafer and the feed current of the engine, these optical parameters may be monitored to very precisely determine the transitions between the layers.

At this stage of the description of the method of the invention, it should be noted that, whatever the means implemented for detecting the emergence of the pores layer, the intensity of the detected signals (temperature and/or friction and/or optical absorption) will also greatly depend on the physical characteristics of the porous layer 122 formed on the substrate 110. For this purpose, in the case where a monocrystalline epitaxial layer must be formed on the porous layer, the invention shows in FIG. 1 a method for the formation of this layer at low temperature (750° C.) so that the initial physical characteristics of the underlying porous layer are not substantially affected and remain optimal for the detection thereof. The detection means described hereabove, whether used alone or in combination, are sufficiently sensitive however to deal with a modification of the physical characteristics of the porous layer which would entail that the formation of the monocrystalline layer would cause the weakening of the detected signal or signals. More particularly, an epitaxial growth of the layer 132 can be executed at higher temperatures than the one mentioned above and more particularly between 900° and 1100° C. More particularly, on solid silicon, epitaxy may be executed at a temperature of 950° C. It could be demonstrated that if this weakened the detection signals of the porous zone because of the modifications in the porous layer resulting from the utilisation of the heat processing at temperatures above 750° C., these remain sufficiently discernible however to precisely control the stoppage of the mechanical or chemical-mechanical polishing.

It should be noted that the invention is extremely advantageous on this point since it takes advantage of the detection of the transition of layers to stop the thinning. Current techniques acting on the selectivity of a chemical attack between the porous layer and the non porous layer could not be implemented at high temperature because of the drop in selectivity.

Figure 4:
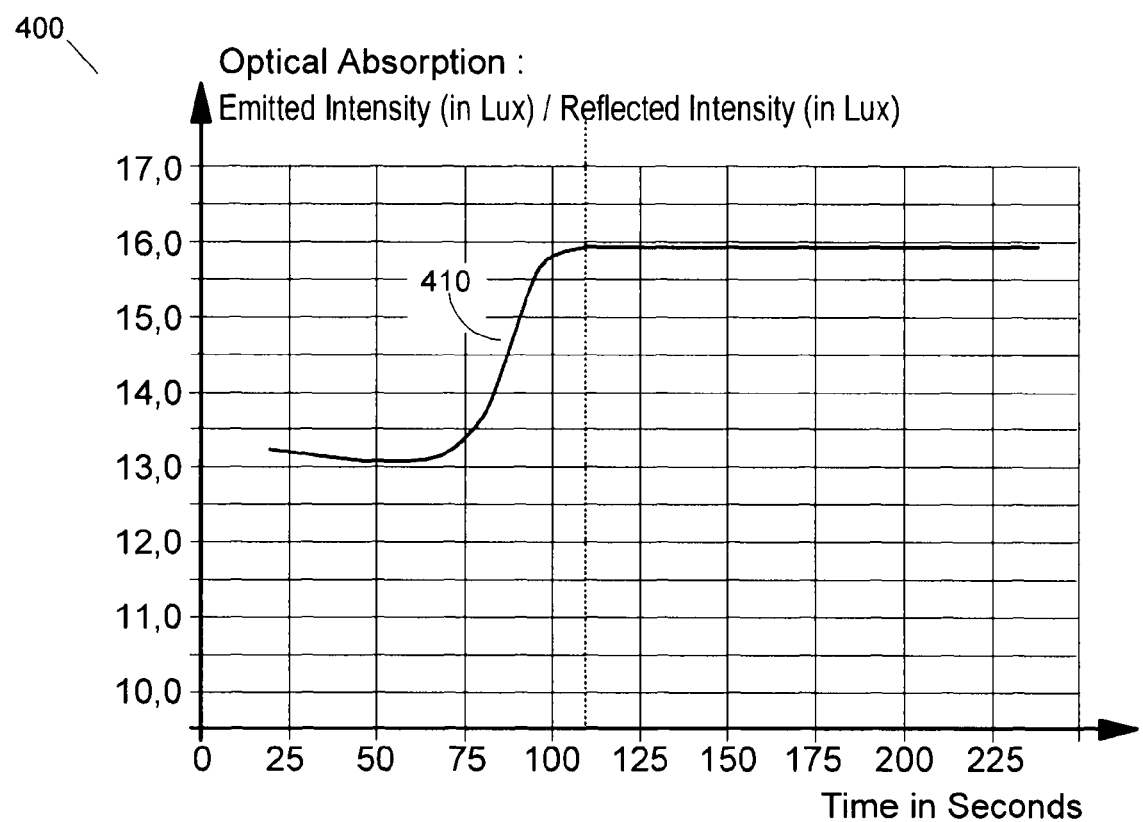
FIG. 4 more particularly illustrates the optical detection mode which is used for detecting the emergence of the layer of porous silicon.

FIG. 4 more particularly illustrates the optical detection mode described hereabove.

The optical absorption between a layer of porous silicon and dense silicon of the substrate is very different. This difference can be noted by an appropriate optical detection system which can work in a wide range of wavelengths, between typically 800 nm up to one micrometer and beyond, i.e. in the red and the infrared. The difference in optical absorption can be observed through the wide range of porous silicon considered previously and the characteristics of which (porosity rate, pore dimensions) can be very different as a function of the type of the devices to be produced.

An optional improvement of detection can be implemented, which consists in adding a specific product into the abrasive solution (slurry), more particularly a "colouring agent" in order to facilitate the optical detection of the type of layer being polished. The colouring agent, when scattering into the layer of porous silicon will change the optical properties thereof and will improve the detection of the transitions.

If it is found necessary to add a colouring agent (or a pigment), and more generally to introduce an additive into the chemical-mechanical polishing solution or slurry, the additive shall necessarily be chosen while considering not only the solubility into the slurry but also depending on the optical detection system used and the properties of absorption and reflectivity of the slurry/additive mixture for the wavelengths of the latter. The additive shall not modify the initial function of the polishing solution either, nor deteriorate one of the materials concerned. More generally, the chemical polishing solutions are most often of an aqueous nature and of an acid (pH≤7) or alkaline (pH≥7) type. A certain number of colouring agents (or pigments) are soluble in water. Companies specialised in the manufacturing of this type of compounds provide colouring agents in the whole range of the visible spectrum of colours.

Additionally, many technical publications are available which enable the persons skilled in the art to judicially select the additive as a function of the characteristics of the optical system used. More particularly, considering the following physico-chemical property: a coloured solution absorbs light in the spectral range complementary to the one it emits. Consequently, if the wavelength of the detector is for example in the red or near infrared (wavelengths of the order of 800 to 1000 nm), a green colouring agent (wavelength of the order of 550 nm) or blue colouring agent (wavelength of the order of 400 nm) will be most appropriate.

The curve 400 gives an example of the difference in optical absorption which can be observed between the dense silicon of the substrate and that of the porous layer and which makes it possible to very precisely detect the transition 410 between the two types of material. The optical absorption in ordinate is the ratio between the intensity of light emitted to the intensity of light reflected, both measured in Lux.

Figure 5:
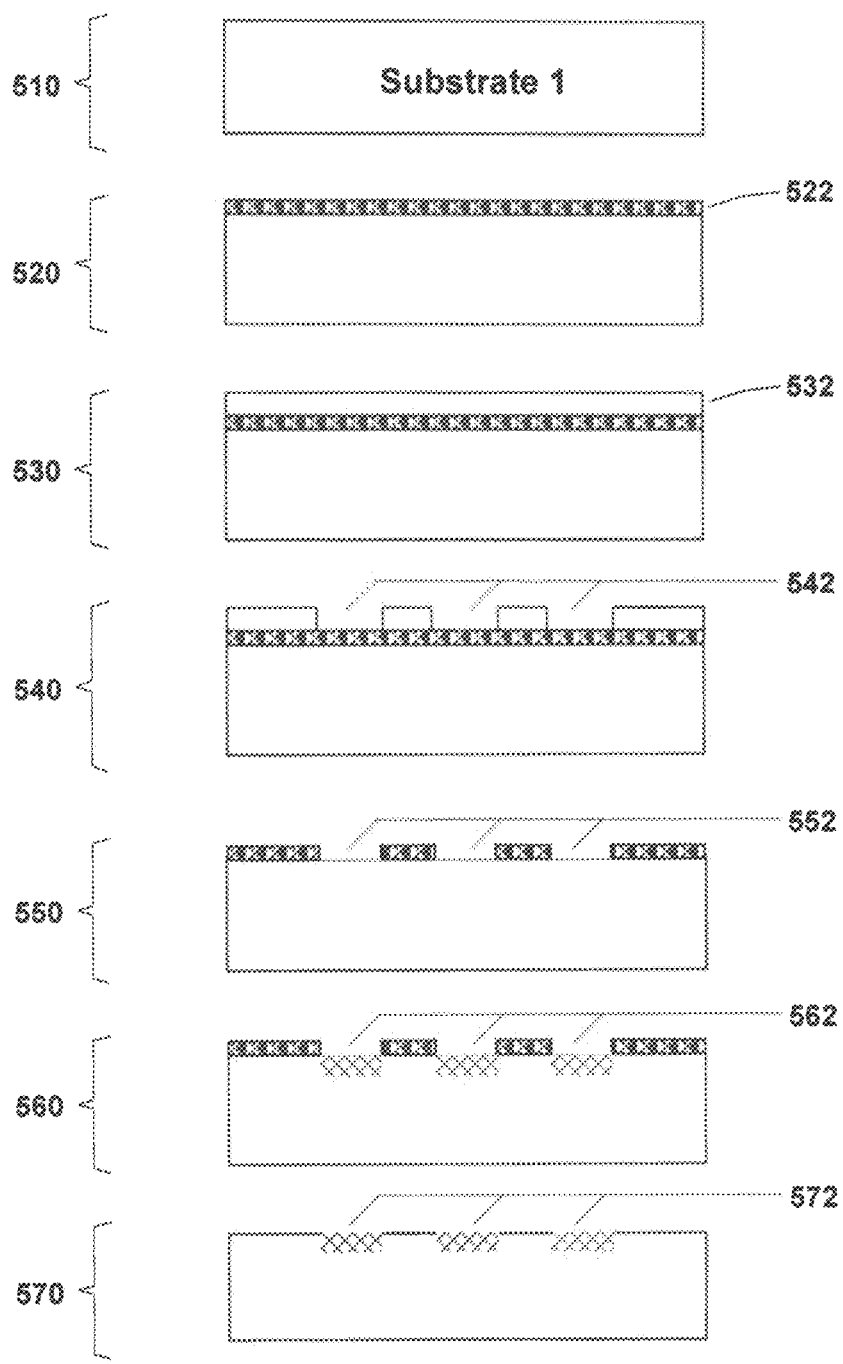
FIG. 5 describes an alternative implementation of the invention, wherein the continuous layer of porous silicon is replaced by the creation of a plurality of patterns made in the porous silicon.

FIG. 5 describes an alternative implementation of the invention wherein a layer of porous silicon provided during the first step 120 of the method described in FIG. 1 on the whole surface of the first substrate is replaced by the creation of a plurality of patterns made of porous silicon.

The creation of the patterns is executed by previously adding, during the step of porosification by anodic dissolution in presence of hydrofluoric acid described in FIG. 2, the following steps which make it possible to define at the surface of the first substrate, instead of the continuous layer, all the porous silicon zones desired to be created.

As for the method described in FIG. 1, the starting point 510 is a monocrystalline silicon substrate.

During the following step 520, on this substrate, a layer of a material 522 will be deposited, which will be used as a protection during the porosification operation for the surfaces between all the zones to be porosified. The deposited material shall have to withstand the anodic dissolution. This is for example the case of silicon nitride ($Si_3N_4$). The deposition can be executed using various methods currently used in microelectronics for example at a relative low temperature by gaseous phase, by forming plasma in a confined enclosure.

The following operations are conventional photolithography operations which make it possible to define the patterns of the zones wherein the porosification of silicon shall have to be carried out. Such operations include the deposition 530 of a layer of resin 532. This deposition is followed by the photolithography operation 540 including the dissolution of the resin at the locations of the patterns to be etched 542 after the latter has been selectively isolated through a mask for example. Etching 550 of the layer of silicon nitride is then carried out at the places defined by the patterns 552, and thereafter all resin is removed.

At this stage 560, porosification of silicon is executed under the same conditions as those described during the step 120 of FIG. 1 and with the means described in FIG. 2. The difference in this case is that only the zones not protected by silicon nitride 562 are porosified in surface. The following step 570 consists in removing the remaining silicon nitride, while leaving only the patterns of porous silicon 572 on the surface of the first substrate.

Except for the fact that patterns of porous silicon exist, in this case, on the surface of the first substrate, instead of a continuous layer of porous silicon, the result is equivalent to the one obtained during the step 120 in FIG. 1. All the other steps (130 to 170) can then be applied similarly to produce devices from both faces of the same substrate, as described in FIG. 1. The critical step of automatic stoppage of polishing during the step of thinning the first substrate 170 will be executed similarly in so far as the surface covered by the patterns of porous silicon is large.

This alternative method according to the invention significantly extends the options of execution which may be considered for the production of devices from both faces of the same substrate. More particularly, the presence of patterns of porous silicon left after the second thinning operation may be revealed and be used for the positioning of the components to be executed on the second face of the substrate with respect to the ones already created on the first face.

Thus, the invention describes the utilisation of a layer of silicon including at least one porous zone as a detection layer inside a substrate for the controlled stoppage of a polishing operation.

The invention claimed is:

1. A method for producing a substrate, said method comprising:
    forming a porous zone in an inner layer of the substrate;
    progressively thinning a thickness of the substrate towards the inner layer including the porous zone;
    completing the progressively thinning by polishing; and
    controlled stopping of the polishing by detecting a transition from a non-porous zone of the substrate to the porous zone during the polishing, the detecting including measuring at least one measurable physical parameter admitting a significant variation that indicates the transition from the non-porous zone of the substrate to the porous zone.

2. A method according to claim 1, wherein the polishing is a mechano-chemical or mechanical polishing.

3. A method according to one of claim 1 or 2, wherein the porous zone forms a whole of the inner layer.

4. A method according to one of claim 1 or 2, wherein the porous zone includes a plurality of porous portions in the inner layer.

5. A method according to claim 4, wherein the plurality of porous portions in the inner layer is revealed at the completion of the progressively thinning so as to enable the alignment of a part of a device produced from a second face of the substrate with a device produced from a first face of the substrate.

6. A method according to claim 1, wherein the forming the porous zone is executed by porosification of a predetermined thickness of the substrate followed by depositing or growing at least one covering layer made of a material participating in production of an electronic device or a hybrid device including at least one of an optical or a mechanical part.

7. A method according to claim 6, wherein the method includes growing the at least one covering layer by epitaxy at a temperature above 750° C.

8. A method according to claim 7, wherein the temperature is between 900° C. and 1,100° C.

9. A method according to claim 6, wherein the depositing or the growing of the at least one covering layer is followed by a transfer onto a secondary substrate fixed on a last one of the at least one covering layer.

10. A method according to claim 1, wherein the progressively thinning of the substrate is quicker than the completing the progressively thinning by polishing.

11. A method according to claim 1, wherein the progressively thinning is performed by a chemical attack, by a mechanical abrasion or by a mechano-chemical polishing.

12. A method according to claim 1, wherein the controlled stopping of the polishing is performed immediately upon the detecting the transition from the non-porous zone of the substrate to the porous zone.

13. A method according to claim 1, wherein the controlled stopping of the polishing is performed after a programmed time after the detecting the transition from the non-porous zone of the substrate to the porous zone.

14. A method according to claim 1, wherein the detecting the transition from the non-porous zone of the substrate to the porous zone is automated.

15. A method according to claim 14, wherein the detecting the transition from the non-porous zone of the substrate to the porous zone is operated without interrupting the progressively thinning by polishing.

16. A method according to claim 14, wherein the detecting the transition from the non-porous zone of the substrate to the porous zone is performed during the completing the progressively thinning by polishing.

17. A method according to claim 1, wherein the completing the progressively thinning by polishing includes:
    a preliminary step of completion,
    a controlled stoppage of the preliminary step of completion by the detecting the transition from the non-porous zone of the substrate to the porous zone, and
    a secondary step of completion until the controlled stoppage of the polishing upon the transition from the porous zone to another non-porous zone of the substrate.

18. A method according to claim 17, wherein the secondary step is carried out at a lower speed than the preliminary step.

19. A method according to claim 1, wherein the detecting the transition from the non-porous zone of the substrate to the porous zone includes exposing a surface being polished to a light source and by monitoring at least one of absorption or optical reflectivity of the surface so as to determine at least one of a beginning or an end of an attack of the porous zone.

20. A method according to claim 19, wherein the monitoring of the at least one of the absorption or the optical reflectivity is enhanced by introducing an additive into the porous zone.

21. A method according to claim 20, wherein the additive is a colouring agent, the colour of which is complementary to a range of wavelengths which can be detected by a system monitoring the at least one of the absorption or the optical reflectivity of the surface being polished.

22. A method according to claim 1, wherein the detecting the transition from the non-porous zone of the substrate to the porous zone includes measuring a driving torque between a polishing head and plate and determining changes in friction that indicate at least one of a beginning or end of an attack of the porous zone.

23. A method according to claim 1, wherein the detecting the transition from the non-porous zone of the substrate to the porous zone includes measuring heating of the substrate and determining changes in temperature that indicate at least one of a beginning or end of an attack of the porous zone.

\* \* \* \* \*